US012635174B2

(12) United States Patent
Chang

(10) Patent No.: US 12,635,174 B2
(45) Date of Patent: May 19, 2026

(54) SEMICONDUCTOR DEVICE AND FABRICATING METHOD THEREOF

(71) Applicant: UNITED MICROELECTRONICS CORP., Hsin-Chu City (TW)

(72) Inventor: Kai-Kuen Chang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 538 days.

(21) Appl. No.: 18/107,990

(22) Filed: Feb. 9, 2023

(65) Prior Publication Data

US 2024/0222501 A1 Jul. 4, 2024

(30) Foreign Application Priority Data

Dec. 28, 2022 (TW) ................................... 111150334

(51) Int. Cl.
*H10D 62/10* (2025.01)
*H10D 30/01* (2025.01)
*H10D 30/65* (2025.01)

(52) U.S. Cl.
CPC ....... *H10D 30/655* (2025.01); *H10D 30/0281* (2025.01); *H10D 62/116* (2025.01)

(58) Field of Classification Search
CPC ............. H10D 30/0281; H10D 62/126; H10D 62/105; H10D 62/115; H10D 30/65; H10D 30/0221; H10D 62/127; H10D 62/113; H10D 62/151; H10D 62/299; H10D 84/859
See application file for complete search history.

(56) References Cited

U.S. PATENT DOCUMENTS

| | | | |
|---|---|---|---|
| 8,673,712 B2 | 3/2014 | Hsiao | |
| 9,153,691 B1 | 10/2015 | Dutta | |
| 9,472,661 B1 * | 10/2016 | Hsiao | .................... H10D 62/378 |
| 11,682,726 B2 | 6/2023 | Yang | |
| 12,136,646 B2 | 11/2024 | Yang | |
| 2022/0209009 A1 | 6/2022 | Yang | |

FOREIGN PATENT DOCUMENTS

| | | |
|---|---|---|
| CN | 103579005 A | 2/2014 |
| CN | 114695549 A | 7/2022 |
| CN | 115347048 A | 11/2022 |
| KR | 10-2014-0011902 A | 1/2014 |
| KR | 10-2022-0024093 A | 3/2022 |

* cited by examiner

*Primary Examiner* — Ajay Ojha
*Assistant Examiner* — Sandra Milena Rodriguez Villanu
(74) *Attorney, Agent, or Firm* — Winston Hsu

(57) ABSTRACT

A semiconductor device and a method of fabricating the same includes a substrate, two first field regions, a gate structure, a first isolation structure, and a plurality of second field regions. The two first field regions are disposed in the substrate, and the gate structure is disposed on the substrate, between the two first field regions. The first isolation structure is disposed in one of the two first field regions, under one side of the gate structure. The second field regions are disposed in the substrate, wherein the second field regions are separately and sequentially arranged to surround an outer periphery of the one of the two first field regions.

13 Claims, 9 Drawing Sheets

SEMICONDUCTOR DEVICE AND FABRICATING METHOD THEREOF

BACKGROUND OF THE INVENTION

1. Field of the Invention

The present disclosure relates to a semiconductor device and a fabricating method thereof, and more particularly, to a semiconductor device serving as a high voltage element and a fabricating method thereof.

2. Description of the Prior Art

With improvement in semiconductor manufacturing, it is conceivable to fabricate control circuits, memories, low-voltage circuits, high-voltage circuits, and the related devices in a single chip for reducing costs and improving performance. And a semiconductor device which is widely applied for enlarging currents or signals in a circuit, serving as an oscillator of a circuit, or serving as a switch device of a circuit, is further applied to be the high-power device or the high-voltage device based on the development of semiconductor processes. For example, a semiconductor device serving as a high-voltage device, is applied in between the internal circuits and the I/O terminals for preventing a large number of charges from suddenly spiking into the internal circuits and thus to avoid the resulted damage to the internal circuit.

Among the current semiconductor devices which are configured as high-voltage device, the structure of these semiconductor devices roughly include a double diffused drain MOS (DDDMOS) with a drift region, and a laterally diffused drain MOS ((LDMOS), and also, a field diffused drain MOS (FDMOS) with drain side shallow trench isolation (STI), and drain extended MOS (DEMOS) and the like, to reduce the lateral electric field thereof, thereby achieving the effect of increasing the breakdown voltage (Vth). It is well-known that characteristics of high breakdown voltage are always required to a high-voltage semiconductor device. However, various components (such as the gate structure, the source region, the drain region, the N-well region and/or the P-well region) arranged in conventional high-voltage semiconductor device are required to have a specific size to achieve sufficient voltage-resistance, and those components occupy a large area of the semiconductor device, leading to the loss of the integration thereof. Thus, it is still a main subject to further improve the structure and the fabrication of the semiconductor device serving as the high-voltage element, in order to meet the practical requirements of the industry.

SUMMARY OF THE INVENTION

In light of the above, the present disclosure is directed to provide a semiconductor device and a fabricating method thereof, in which, slot-shaped field regions are at least formed in a high-voltage terminal, with the slot-shaped field regions separately arranged along an outer periphery of the high-voltage terminal, so as to further improve the breakdown voltage and the internal electrical properties of the semiconductor device without changing the doping concentration of the field regions, and maintaining the diffusion rule of each doping region at the same time. Accordingly, the fabricating method of a semiconductor device in present disclose enables to gain the semiconductor device with better element reliability, under a simplified process flow and lower cost, so as to prevent from the latch-up effect in a more sufficient manner.

According to one embodiment of the present disclosure, a semiconductor device is provided and includes a substrate, two first field regions, a gate structure, a first isolation structure, and a plurality of second field regions. The two first field regions are disposed in the substrate, and the gate structure is disposed on the substrate, between the two first field regions. The first isolation structure is disposed in one of the two first field regions, under a first side of the gate structure. The second field regions are disposed in the substrate, wherein the second field regions are separately arranged to surround an outer periphery of the one of the two first field regions.

According to another embodiment of the present disclosure, a method of fabricating a semiconductor device is provided and includes the following steps. Firstly, a substrate is provided, and two first field regions are formed in the substrate. Next, a gate structure is formed on the substrate, between the two first field regions, and a first isolation structure is formed in one of the two first field regions, under a first side of the gate structure. Then, a plurality of second field regions is formed in the substrate, with the second field regions being separately arranged to surround an outer periphery of the one of the two first field regions.

According to another embodiment of the present disclosure, a semiconductor device is provided and includes a high-voltage terminal, a diffusion region, and a plurality of field regions. The diffusion region surrounds the semiconductor device, and the field regions are separately arranged along an outer periphery of the high-voltage terminal to surround the high-voltage terminal, and the field regions and the diffusion region have a same conductive type and are partially overlapped with each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 4 illustrate schematic diagrams of a semiconductor device according to a second embodiment of the present disclosure, in which:

FIG. 2 is a schematic top view of the semiconductor device according to the second embodiment of the present disclosure;

FIG. 3 is a schematic cross-sectional view taken along a cross line A-A' of FIG. 2; and FIG. 4 is another schematic top view of the semiconductor device according to the second embodiment of the present disclosure.

FIG. 5 to FIG. 7 illustrate schematic diagrams of a fabricating method of a semiconductor device according to the second embodiment of the present disclosure, in which:

FIG. 5 is a schematic cross-sectional view of a semiconductor device after forming an isolation structure;

FIG. 6 is a schematic cross-sectional view of a semiconductor device after forming a field region; and FIG. 7 is a schematic cross-sectional view of a semiconductor device after forming a diffusion region.

FIG. 8 to FIG. 10 illustrate schematic diagrams of a semiconductor device according to a third embodiment of the present disclosure, in which:

FIG. 8 is a schematic top view of the semiconductor device according to the third embodiment of the present disclosure;

FIG. 9 is a schematic cross-sectional view taken along a cross line A-A' of FIG. 8; and FIG. 10 is another schematic top view of the semiconductor device according to the third embodiment of the present disclosure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
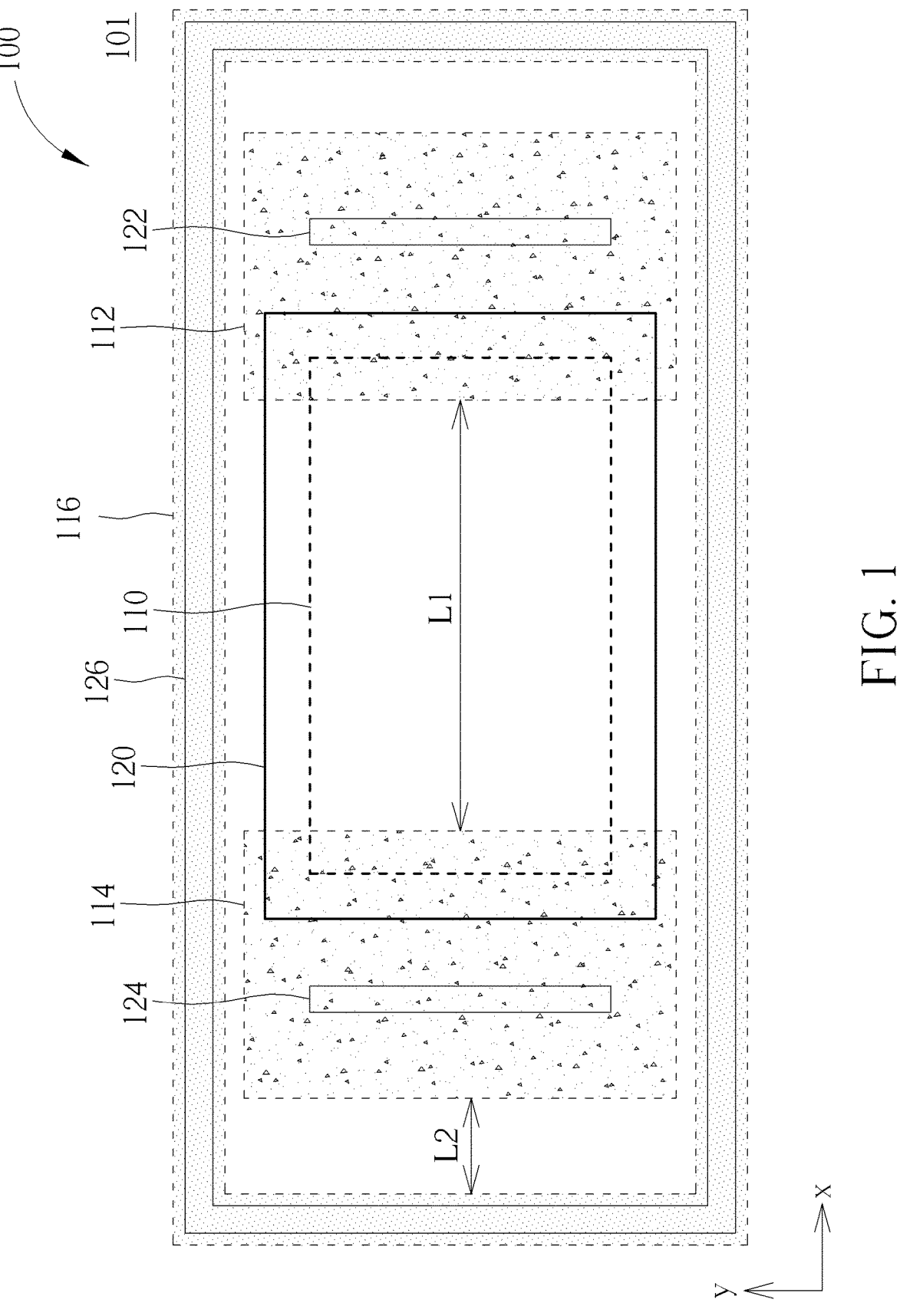
FIG. 1 illustrates a schematic diagram of a top view of a semiconductor device according to a first embodiment of the present disclosure.

Please refer to FIG. 1, which is a schematic top view illustrating a semiconductor device 100 according to the first embodiment of the present disclosure. The semiconductor device 100 includes a substrate 101, two diffusion regions 110, 126, a gate structure 120, two source/drain regions 122, 124, and at least one isolation structure (not shown in the drawings). In the present embodiment, the substrate 101 for example includes a silicon substrate, an epitaxial silicon substrate, a silicon germanium substrate, a silicon carbide substrate, or a silicon-on-insulator (SOI) substrate, but is not limited thereto. The at least one isolation structure is formed within the substrate 101, and which may be a shallow trench isolation (STI) being formed through an etching process, a deposition process and a planarization process, or a field oxide (FOX) being formed through a local oxidation of silicon (LOCOS) process, thereby defining the locations of the diffusions 110, 126 and the source/drain regions 122, 124 in the substrate 101 to further surround the diffusions 110, 126 and the source/drain regions 122, 124. It is noted that, in order to clearly show the relationship between the specific components (such as the diffusion regions 110, 126, the gate structure 120, and the source/drain regions 122, 124), the at least one isolation structure is not illustrated in FIG. 1, and however, people well-skilled in the art should easily understand the location of the at least one isolation structure according to the arrangement of the diffusion regions 110, 126, and the source/drain regions 122, 124.

Precisely speaking, the substrate 101 for example includes a first conductive type (for example an N-type), and the diffusion region 110 disposed within the substrate 101 also includes the first conductive type (for example the N-type), wherein the doping concentrating of the diffusion region 110 may be higher than the doping concentration of the substrate 101, but is not limited thereto. People skilled in the arts should easily understand that the precise doping concentration of the diffusion 110 and/or the substrate 101 may be further adjusted based on the practical requirement. The gate structure 120 is disposed on the substrate 101, and which may include a polysilicon gate or a metal gate, and the two source/drain regions 122, 124 are respectively disposed in the substrate 101, at two opposite sides of the gate structure 120. The at least one isolation structure is respective disposed between the two source/drain regions 122, 124 and the gate structure 120, so that, the two source/drain regions 122, 124 are not directly in contact with the gate structure 120. Furthermore, the semiconductor device 100 includes two first field regions 112, 114 disposed within the substrate 101, also at the two opposite sides of the gate structure 120 respectively. It is noted that, the source/drain regions 122, 124 are respectively disposed within the first field regions 112, 114, and the first field regions 112, 114 preferably include relative deeper doping positions and a relative greater doping areas within the substrate 101 respectively, with the first field regions 112, 114 being disposed under the at least isolation structure from a cross-sectional view (not shown in the drawings), and surrounding along an outer periphery of the source/drain regions 122, 124 to partially overlap with the two opposite sides of the gate structure 120 respectively, from a top view as shown in FIG. 1.

In the present embodiment, the source/drain regions 122, 124 and the first field regions 112, 114 all have a second conductive type (for example a P-type) being complementary to the first conductive type (for example the N-type), and the doping concentration of the first field regions 112, 114 is preferably smaller than the doping concentration of the source/drain regions 122, 124, to configure as a drift region with a relative higher resistance to reduce the voltage which is introduced by the source/drain regions 122, 124 thereby. For example, the doping concentration of the first field regions 112, 114 is for example about 1E17 to 1E18 per cubic centimeter, and the doping concentration of the source/drain regions 122, 124 is for example about 2E17 per cubic centimeter, but not limited thereto. With these arrangements, the two first field regions 112, 114 and the two source/drain regions 122, 124 may have symmetrical structure, so that, a portion of the diffusion region 110 is just disposed below the gate structure 120, and between the source/drain regions 122, 124, thereby serving as a channel of the gate structure 120. Then, a length L1 of the channel of the gate structure 120 is namely the distance between the two first field regions 112, 114 in the horizontal direction (the x-direction), as shown in FIG. 1.

On the other hand, the diffusion region 126 is also disposed within the substrate 101, to surround at an outer periphery of the first field regions 112, 114, the source/drain regions 122, 124, and the gate structure 120, and the diffusion region 126 is preferably not directly in contact with the source/drain regions 122, 124, with the at least one isolation structure being also disposed between the diffusion region 126 and the two source/drain regions 122, 124 respectively, for electrical isolation. Also, the semiconductor device 100 further includes a second field region 116 disposed within the substrate 101. The second field region 116 also includes a relative deeper doping position and a relative greater doping area within the substrate 101, as in comparison with that of the diffusion region 126, so that, the second field region 116 may be disposed below the diffusion region 126 and the at least one isolation structure from a cross-sectional view (not shown in the drawings), and may be disposed along an outer periphery of the entire diffusion region 126 from a top view as shown in FIG. 1.

In the present embodiment, the second field region 116, and the second diffusion region 126 within the second field region 116 both include the first conductive type (for example the N-type) being complementary to the conductive type (for example the P-type) of the first field regions 112, 114 and the source/drain regions 122, 124, and the doping concentration of the second field region 116 is preferably smaller than the doping concentration of the diffusion region 126. For example, the doping concentration of the second field region 116 is for example about 1E17 to 1E18 per cubic centimeter, and the doping concentration of the diffusion region 126 is for example about 2E17 per cubic centimeter, but not limited thereto. People skilled in the arts should understand that, the aforementioned doping concentrations may also be adjusted based on practical requirements. It is noted that, the second field region 116 and the diffusion region 126 may together serve as a pick-up ring for the high-voltage signals within the semiconductor device 100, thereby avoiding the latch-up effect. Accordingly, the doping concentration of the boundary (with a distance L2) between the second field region 116 and the two first field regions 112, 114 adjacent thereto, as well as the doping concentration of the second field region 116, may directly affect the breakdown voltage of the semiconductor device 100 and the internal electrical property.

It is also noted that, although the second field region 116 and the diffusion region 126 are all in a rectangular shape as shown in FIG. 1, the present disclosure is not limited thereto. In another embodiment, the field region and the diffusion region may also include other shapes such as a square shape, a circular shape, a racetrack shape or other suitable shapes. With these arrangements, the whole structure of the semiconductor device 100 of the present embodiment may present a symmetrical structure, with the left and right, or the top and the bottom of the semiconductor device 100 being symmetrical to each other. Then, both of the two source/drain regions 122, 124 of the semiconductor device 100 may function like the high-voltage terminal, as a high-voltage signal passes from the high-voltage terminal, the output signal is turn into a low-voltage signal through an impedance generated by the boundary between the second field region 116 and the first field regions 112, 114 adjacent thereto, thereby avoiding the breakdown of the semiconductor device 100. In the present embodiment, people skilled in the arts may further improve the breakdown voltage of the semiconductor device 100 by enlarging the distance L2 according to practical requirements as a specific doping concentration is maintained.

According to the present embodiment, the semiconductor device 100 may serve as a P-type field diffused drain MOS (FDPMOS) transistor, thereby being a high-voltage element, and which not only enables to achieve the voltage reduction in a stable manner, but also has good device reliability. Thus, the high-voltage element of the present embodiment may be applied to a semiconductor device with an operating voltage being higher than 20 volts (V) (for example, being about 22 volts), but is not limited thereto.

People skilled in the arts should easily realize the semiconductor device in the present disclosure is not limited to be the aforementioned type, and which may further include other examples or variations. For example, according to another embodiment of the present disclosure, another semiconductor device is provided, and which may further increase the breakdown voltage thereof without damage to the device integration (namely without enlarging the distance L2). The following description will detail the different embodiments of the semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
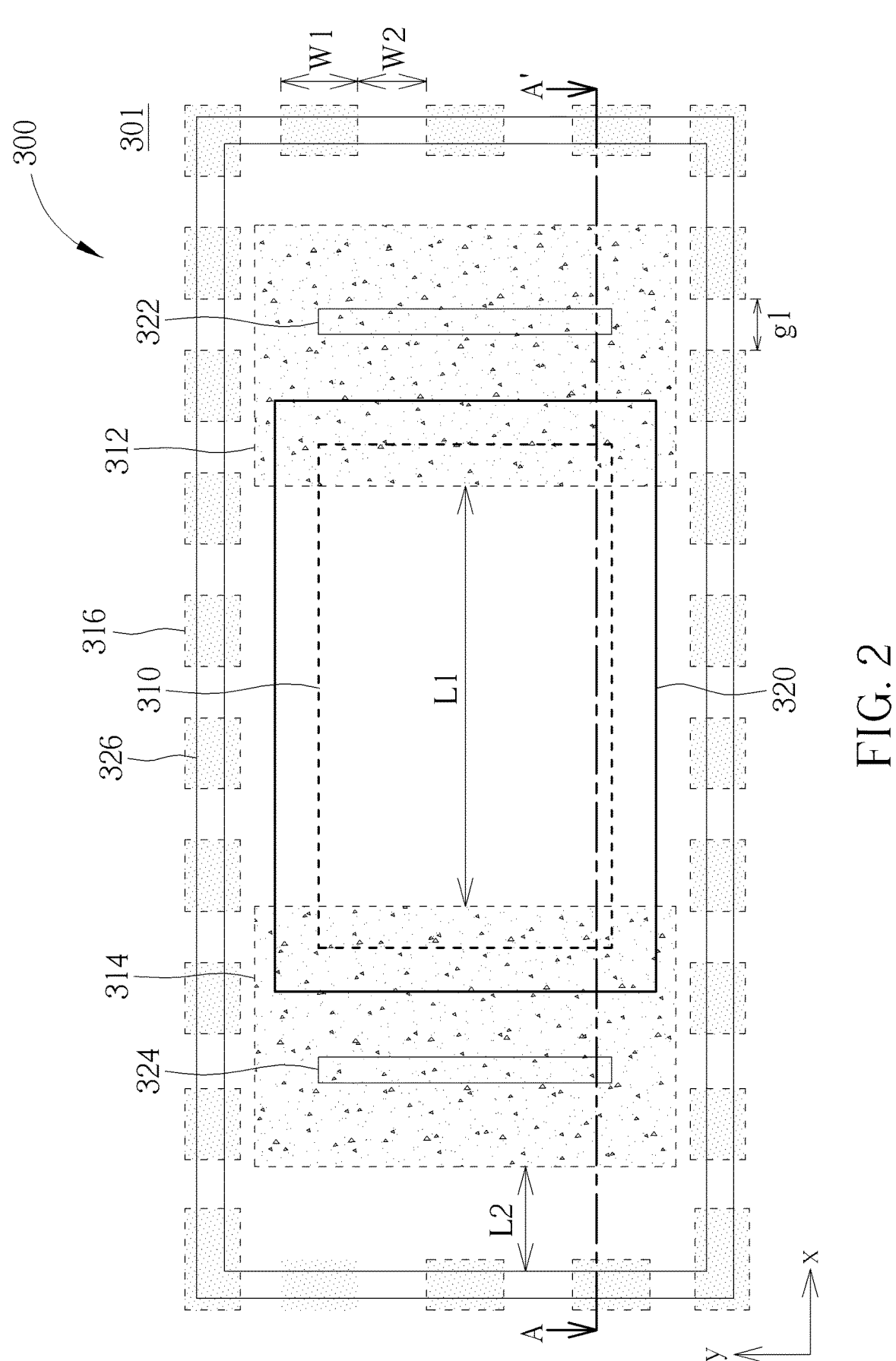
Figure 3:
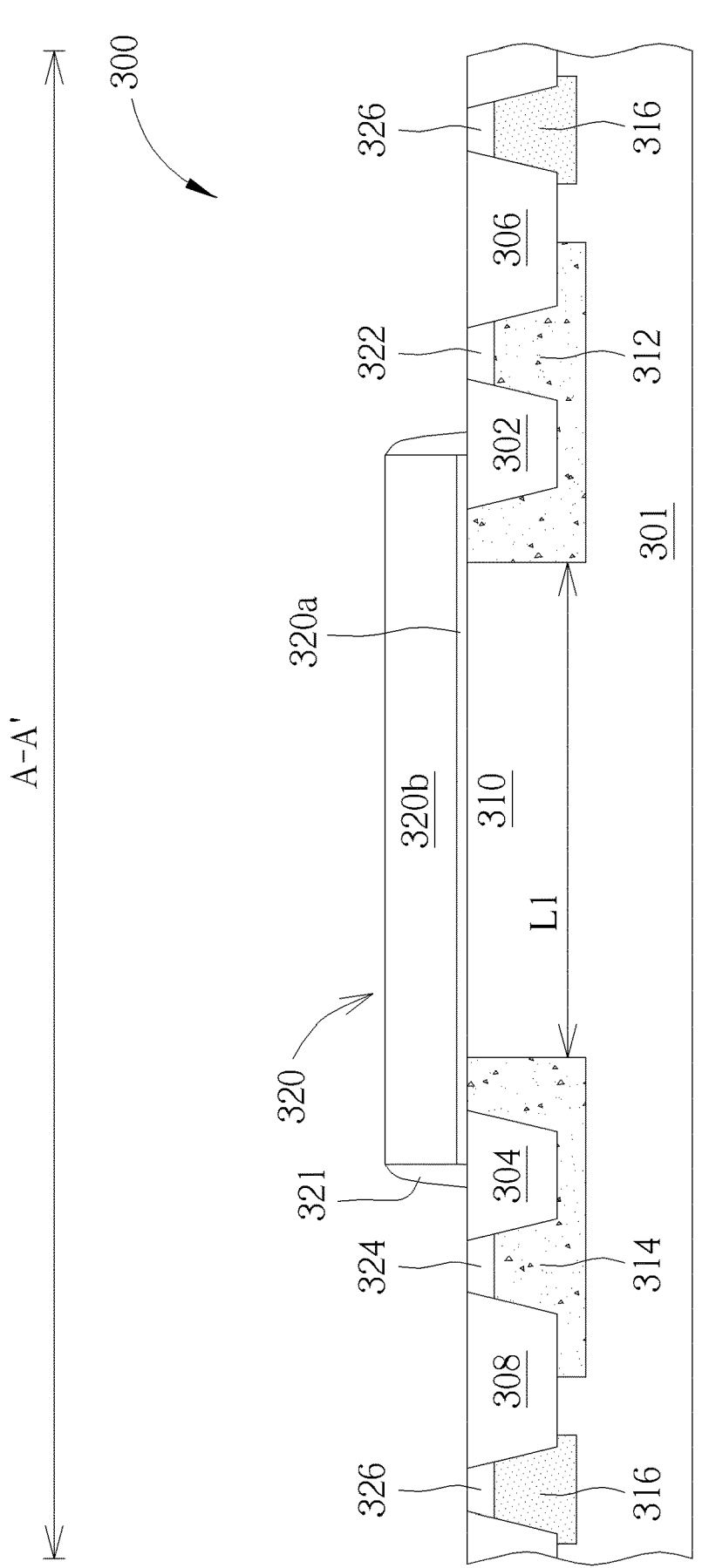
Figure 4:
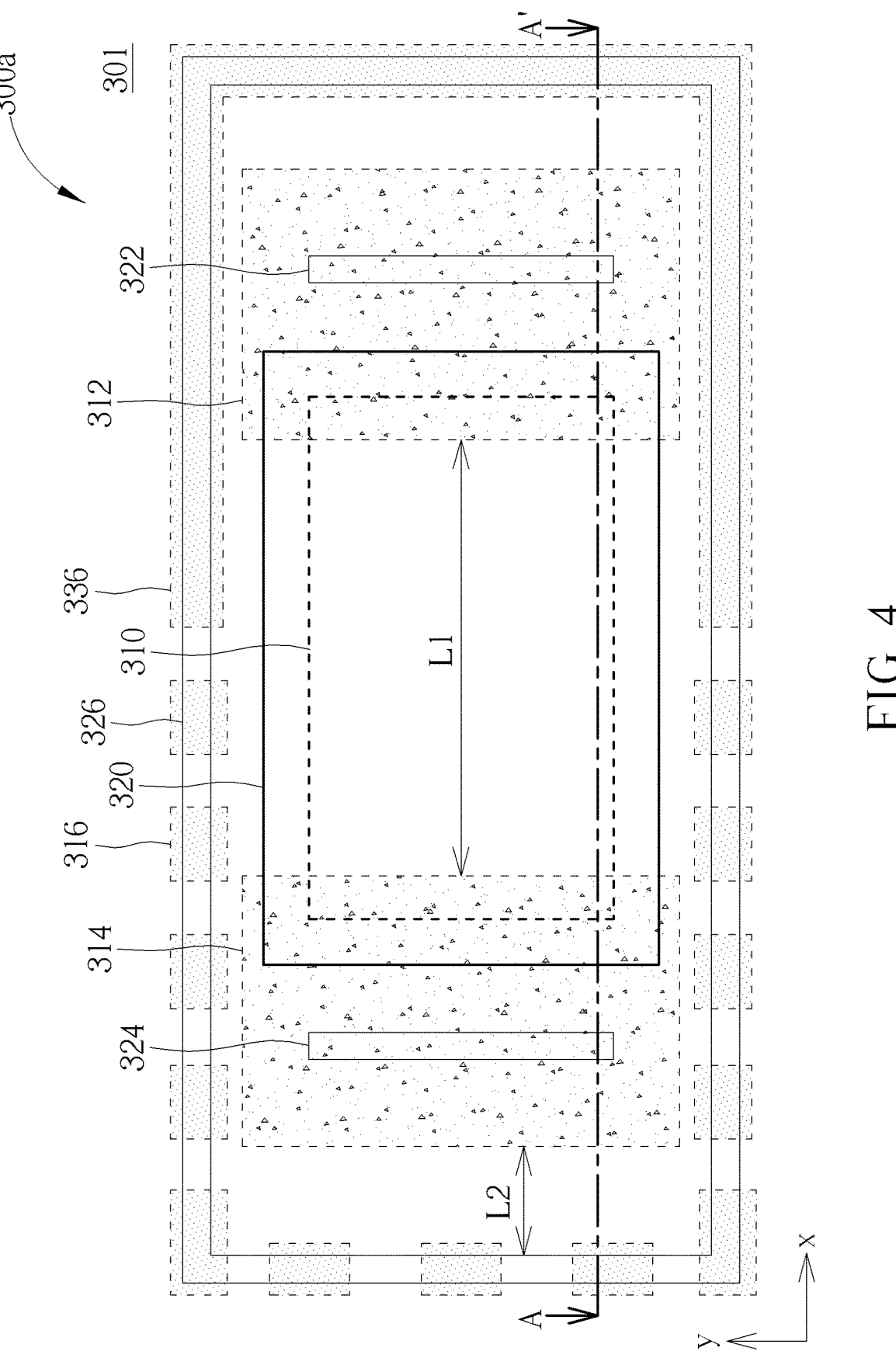

Please refer to FIG. 2 to FIG. 4, which are schematic diagrams illustrating a semiconductor device 300 according to the second embodiment of the present disclosure. The structure of the semiconductor device 300 of the present embodiment is substantially similar to that of the semiconductor device 100 in the aforementioned first embodiment, including a substrate 301, two diffusion regions 310, 326 and two source/drain region 322, 324 disposed within the substrate 301, and a gate structure 320 disposed on the substrate 301, with the aforementioned elements begin substantially the same as those of the substrate 101, the diffusion regions 110, 126, the source/drain regions 122, 124, and the gate structure 120, and all similarity between the present embodiment and the aforementioned embodiment are not redundant described hereinafter. The difference between the present embodiment and the aforementioned embodiment is mainly in that a slot-shaped field region is disposed in the substrate 301 to surround the source/drain regions 322, 324 and the gate structure 320.

Please refer to FIG. 2 and FIG. 3, the substrate 301 (having a first conductive type, such as the N-type) for example includes a silicon substrate, a silicon containing substrate, or a SOI substrate, and a plurality of isolation structures 302, 304, 306, 308 is disposed within the substrate 301, to define the locations of the diffusion regions 310, 326 (having the first conductive type such as the N-type) and the source/drain regions 322, 324 (having the second conductive type, such as the P-type) within the substrate 301, to further surround the diffusion regions 310, 326 and the source/drain regions 322, 324. In the present embodiment, the isolation structures 302, 304, 306, 308 may be a shallow trench isolation (as shown in FIG. 2 and FIG. 3) formed within the substrate 301, but not limited thereto. Also, the gate structure 320 is formed on the substrate 301, covered on the diffusion region 310, the gate structure 320 further includes a gate dielectric layer 320a, a gate layer 320b, and a spacer 321 surrounding the gate dielectric layer 320a and the gate layer 320b, wherein the gate layer 320b may include a polysilicon gate or a metal gate, but not limited thereto.

It is noted that, in the present embodiment, the isolation structures 302, 304 are respectively disposed in the substrate 301, at two opposite sides of the gate structure 320, to partially overlap the gate structure 320 respectively, so that, the source/drain regions 322, 324 at the two opposite sides of the gate structure 320 may not directly in contact with the gate structure 320. The isolation structures 306, 308 are respectively disposed between the two source/drain regions 322, 324 and the diffusion region 326, with the source/drain regions 322, 324 being electrically isolation with the diffusion region 326.

The semiconductor device 300 also includes two first field regions 312, 314 (having the second conductive type such as the P-type) disposed within the substrate 301, and which includes a relative smaller doping concentration and a relative greater and deeper doping area in comparison with that of the source/drain regions 322, 324, to configure as a drift region with a relative higher resistance to reduce the voltage which is introduced by the source/drain regions 322, 324 thereby. For example, the doping concentration of the first field regions 312, 314 is for example about 1E17 to 1E18 per cubic centimeter, and the doping concentration of the source/drain regions 322, 324 is for example about 2E17 per cubic centimeter, but not limited thereto. Accordingly, the first field regions 312, 314 may be disposed below the source/drain regions 322, 324 and the isolation structure 302, 304 from a cross-sectional view as shown in FIG. 3, the first field regions 312, 314 may surround the outer periphery of the source/drain regions 322, 324 from a top view as shown in FIG. 2, to partially overlap with the gate structure

7

320. Furthermore, the outer peripheries of the first field regions 312, 314 and the source/drain regions 322, 324 are also surrounded by the diffusion region 326 within the substrate 326, and the diffusion region 326 for example includes a rectangular shape as shown in FIG. 2, but not limited thereto. With these arrangements, the whole structure of the semiconductor device 300 of the present embodiment may present a symmetrical structure, with a portion of the diffusion region 310 being between the first field regions 312, 314 to serve as a channel (also having the length L1) of the gate structure 320, and both of the two source/drain regions 322, 324 may also function like the high-voltage terminal, as shown in FIG. 2 and FIG. 3.

It is noted that, the semiconductor device 300 of the present embodiment further includes a plurality of second field regions 316 (having the first conductive type, such as the N-type), which are separately disposed within the substrate 301 to partially overlap with the diffusion region 326. The second field regions 316 also include a relative deeper doping location and a relative greater doping area within the substrate 301, so that, the second field regions 316 may therefore be disposed below the diffusion region 326 and the isolation structures 306, 308 from a cross-sectional view as shown in FIG. 3, and sequentially arranged along the outer periphery of the first field region 312, 314 to partially surround the outer periphery of the diffusion region 326.

Furthermore, it is also noted that, the doping concentration of the second field regions 316 is smaller than the doping concentration of the diffusion region 326. For example, the doping concentration of the second field regions 316 is for example about 1E17 to 1E18 per cubic centimeter, and the doping concentration of the diffusion region 326 is for example about 2E17 per cubic centimeter, but not limited thereto. Meanwhile, in order to maintain the doping concentration in an overall uniform manner, each of the second field regions 316 preferably has the same length W1 in the horizontal direction (such as the x-direction) or in the vertical direction (such as the y-direction), and two adjacent ones of the second field regions 316 are preferably separated by a gap g1 with the same length W2 in the horizontal direction (such as the x-direction) or in the vertical direction (such as the y-direction), to provide an uniform impedance. The length W1 is for example being about 0.2 micrometers (μm) to 2 μm, and the length W2 of the gap g1 is for example being about 0.2 μm to 1 μm, but not limited thereto. People skilled in the arts may further change the doping concentration of the second field regions 316 by adjusting the length W1 of the second field regions 316 or the length W2 of the gap g1 based on practical requirements, so as to modulate the voltage reduction degree of the semiconductor device 300.

With these arrangements, the second field regions 316 and the diffusion region 326 also together serve as a pick-up ring for the high-voltage signals within the semiconductor device 300. In addition, the slot-shaped, discontinuous second field regions 316 are disposed around the first field regions 312, 314, so as to further improve the breakdown voltage of the semiconductor device 300 and the internal electrical property thereof, without changing the doping concentration of the second field region 316, and with the same boundary (namely the distance L2) between the second field regions 316 and the first field regions 312, 314 adjacent thereto being maintained. Thus, the semiconductor device 300 of the present embodiment enables to further avoid the latch-up effect. According to the present embodiment, the semiconductor device 300 may also serve as a P-type field diffused drain MOS transistor, thereby being a high-voltage element, and which enables to be applied to a semiconductor device with an operating voltage being higher than 20 volts (for example, being about 22 volts), but is not limited thereto.

It is additionally noted that, although the aforementioned device is exemplified by sequentially arranging the slot-shaped second field regions 316 along the outer periphery of the first field regions 312, 314, to surround the first field regions 312, 314 and the source/drain regions 322, 324, the present disclosure is not limited thereto. Please refer to FIG. 4, in another embodiment, the slot-shaped, discontinuous second field regions 316 are only disposed at the high-voltage terminal of a semiconductor device 300a, such as the source/drain region 324 at the left side, with the low-voltage terminal of the semiconductor device 300a, such as the source/drain region 322 at the right side being surrounded by a third field region 336 in a continuous, C-shaped. The third field region 336 for example includes the same doping concentration and the same doping depth as those of the second field regions 316. In this way, the slot-shaped second field regions 316 locally surround at the outer periphery of the high-voltage terminal (namely, the first field region 314 and the source/drain region 324), which may also achieve the functions on increasing the breakdown voltage of the semiconductor device 300a, as well as the internal electric property thereof, thereby effectively avoiding the latch-up effect.

In addition, although the aforementioned embodiments are all exemplified as the P-type field diffused drain MOS transistor, the present disclosure is not limited thereto. In another embodiment, the N-type field diffused drain MOS transistor may also be formed, for example including the substrate, the diffusion regions and the second field regions being in a first conductive type such as the P-type, and the first field regions and the source/drain regions being in a complementary second conductive type such as the N-type.

Figures 5, 6:
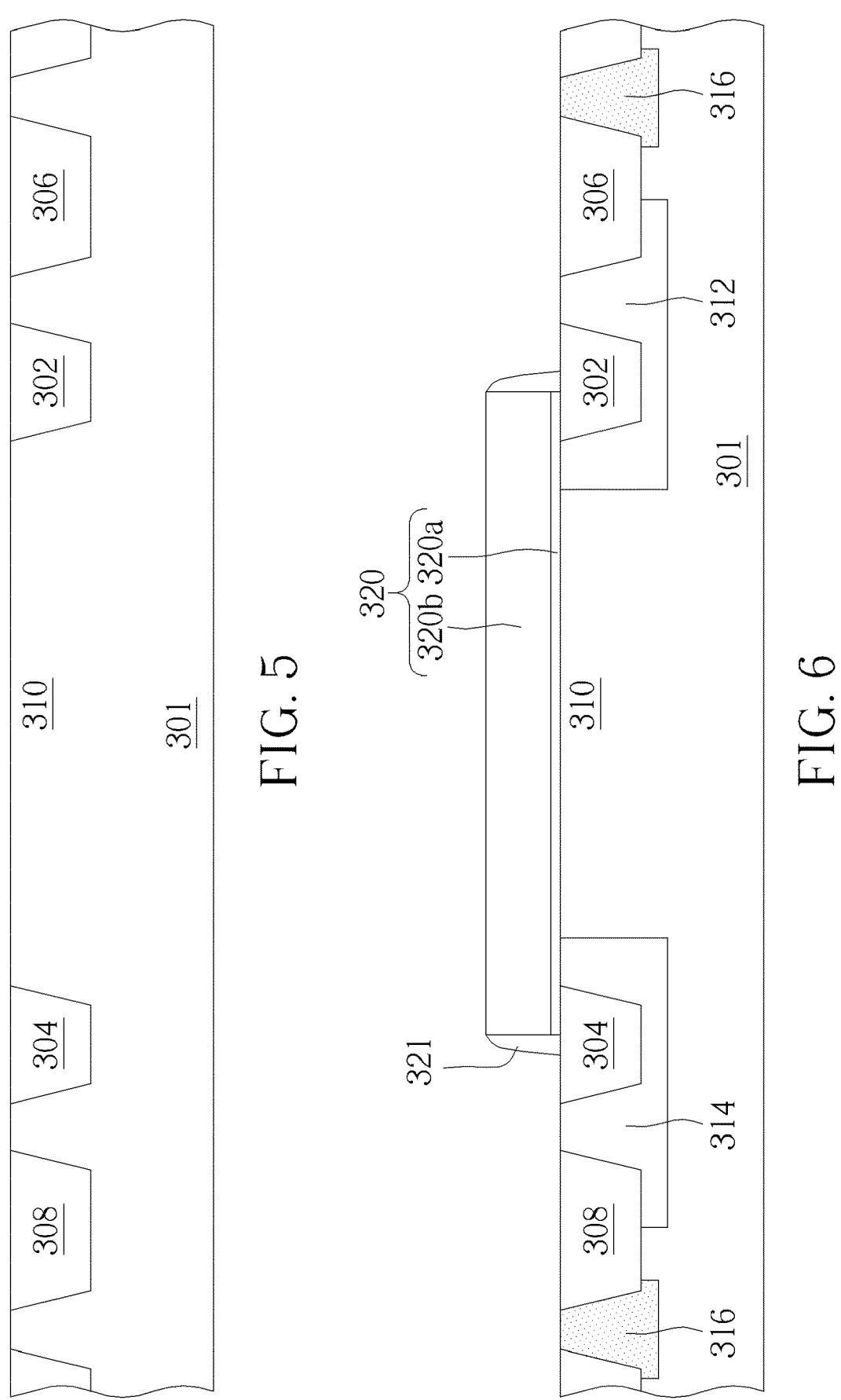

In order to enable people skilled in the arts to further realize the semiconductor device described in the present disclosure, a fabricating method of the semiconductor device 300 of the present disclosure is further described in detail below. Please refer to FIG. 5 to FIG. 7, which are schematic cross-sectional views of a fabricating method of the semiconductor device 300 according to the second embodiment of the present disclosure. Firstly, as shown in FIG. 5, the substrate 301 is provided (having a first conductive type, such as the N-type), and the diffusion region 310 is formed within the substrate 301, wherein the diffusion region 310 also includes the first conductive type (such as the N-type) and a relative larger doping concentration in comparison with that of the substrate 301. For example, the doping concentration of the diffusion region 310 is about 1E13 to 1E15 per cubic centimeter, but not limited thereto, and people skilled in the arts may further adjust the aforementioned doping concentration based on practical requirements.

Next, the isolation structures 302, 304, 306, 308 are separately formed within the substrate 301. In one embodiment, the formation of the isolation structures 302, 304, 306, 308 may be accomplished by first forming a plurality of trenches (not shown in the drawings) in the substrate 301 through an etching process, and at least one isolation material such as silicon oxide, silicon nitride or silicon oxynitride is filled in the trenches, to form a plurality of shallow trench isolations after a planarization process, with the shallow trench isolation having coplanar top surfaces with the top surface of the substrate 301 to serve as the isolation structures 302, 304, 306, 308, as shown in FIG. 5, but not limited thereto.

Then, at least one ion implantation process is performed on the substrate 301 through at least one mask layer (not shown in the drawings), to form a plurality doping regions within the substrate 301 to serve as the first field regions 312, 314 and the second field regions 316. Precisely speaking, the first field regions 312, 314 include the second conductive type such as the P-type, and which is formed below the isolation structures 302, 304. The second field regions 316 include the first conductive type such as the N-type, and which is formed below the isolation structures 306, 308, as shown in FIG. 6. After that, the at least one mask layer is removed, and the gate structure 320 is then formed on the substrate 301. In one embodiment, the formation of the gate structure 320 may be accomplished by sequentially forming a gate dielectric material (not shown in the drawings) and a gate material layer (not shown in the drawings, for example including a polysilicon layer or a metal layer) on the substrate 301, patterning the gate dielectric material layer and the gate material layer, to form the gate dielectric layer 320a and the gate layer 320b stacked sequentially on the substrate 301. Then, a deposition process and an etching back process are performed to form the spacer 321 disposed on sidewalls of the gate dielectric layer 320a and the gate layer 320b to surround the gate dielectric layer 320a and the gate layer 320b.

Figure 7:
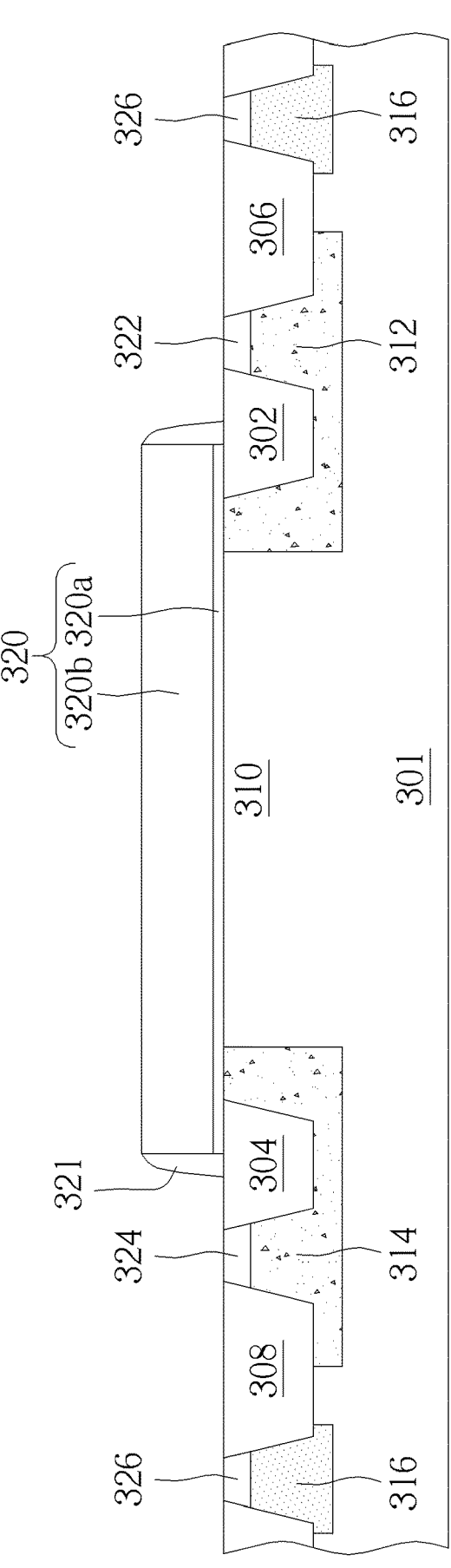

Finally, as shown in FIG. 7, an ion implantation process is performed through another mask layer (not shown in the drawings) formed on the substrate 301, to form two diffusion regions having the second conductive type (such as the P-type) at the two opposite sides of the gate structure 320 to serve as the source/drain regions 322, 324. Also, another ion implantation process is performed through a further mask layer (not shown in the drawings) to form the diffusion region 326 (including the first conductive type, such as the N-type) surrounding at the outer periphery of the first field regions 312, 314 and the source/drain regions 322, 324. According to the aforementioned processes, the fabrication of the semiconductor device 300 according to the second embodiment of the present disclosure is accomplished.

Figure 8:
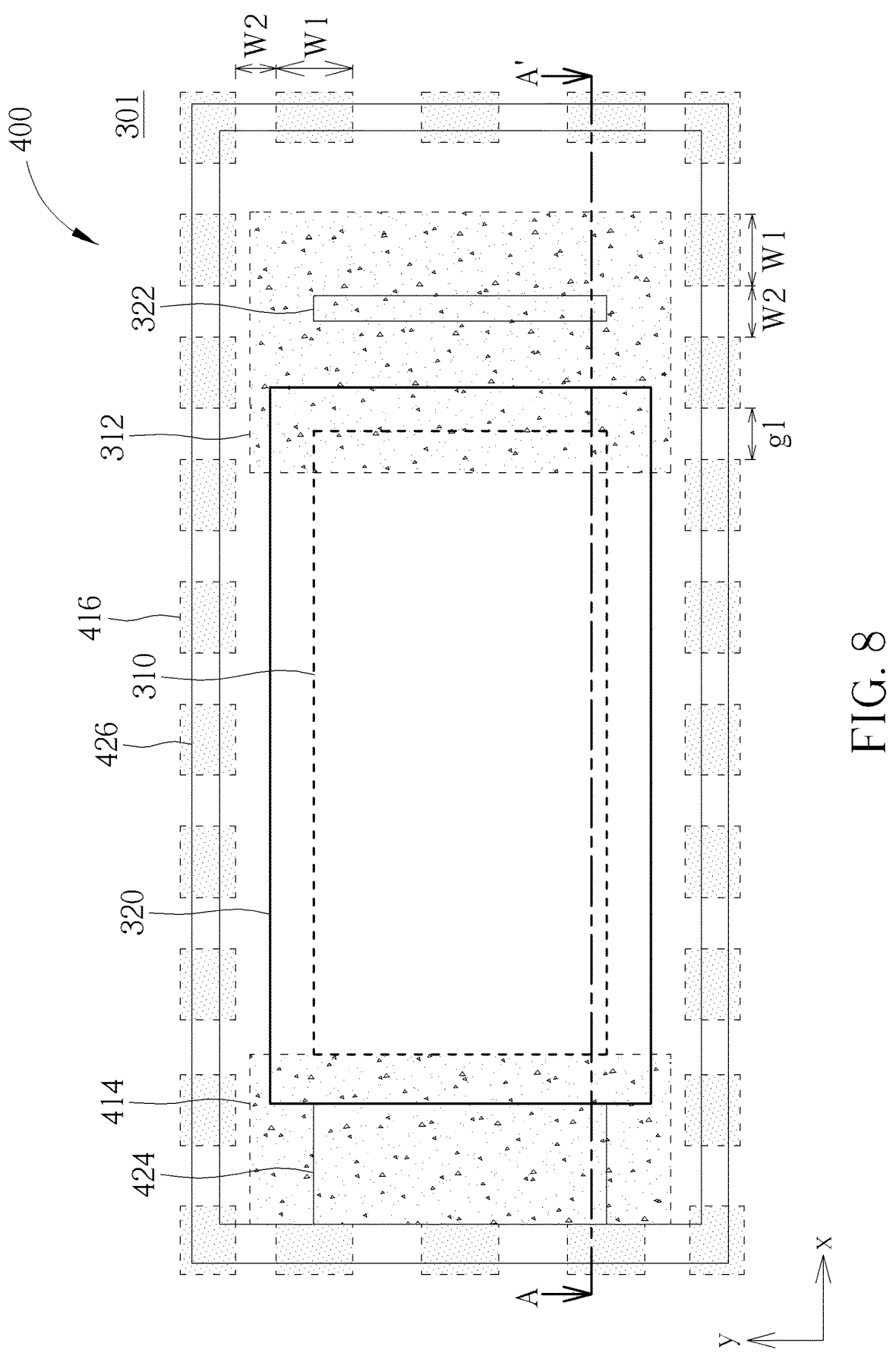
Figure 9:
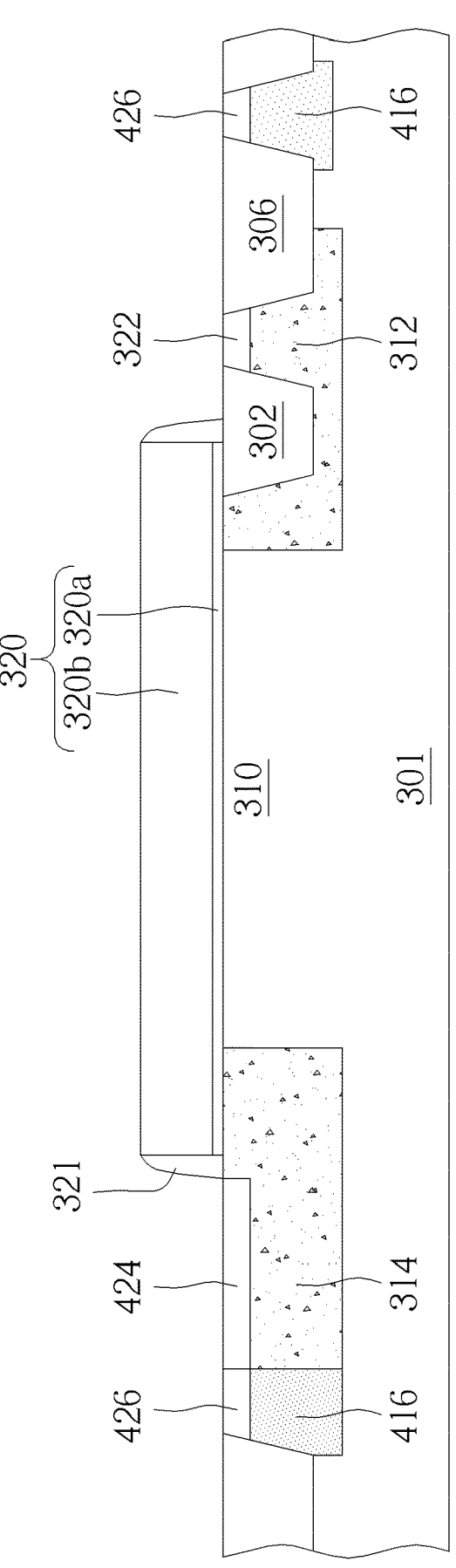
Figure 10:
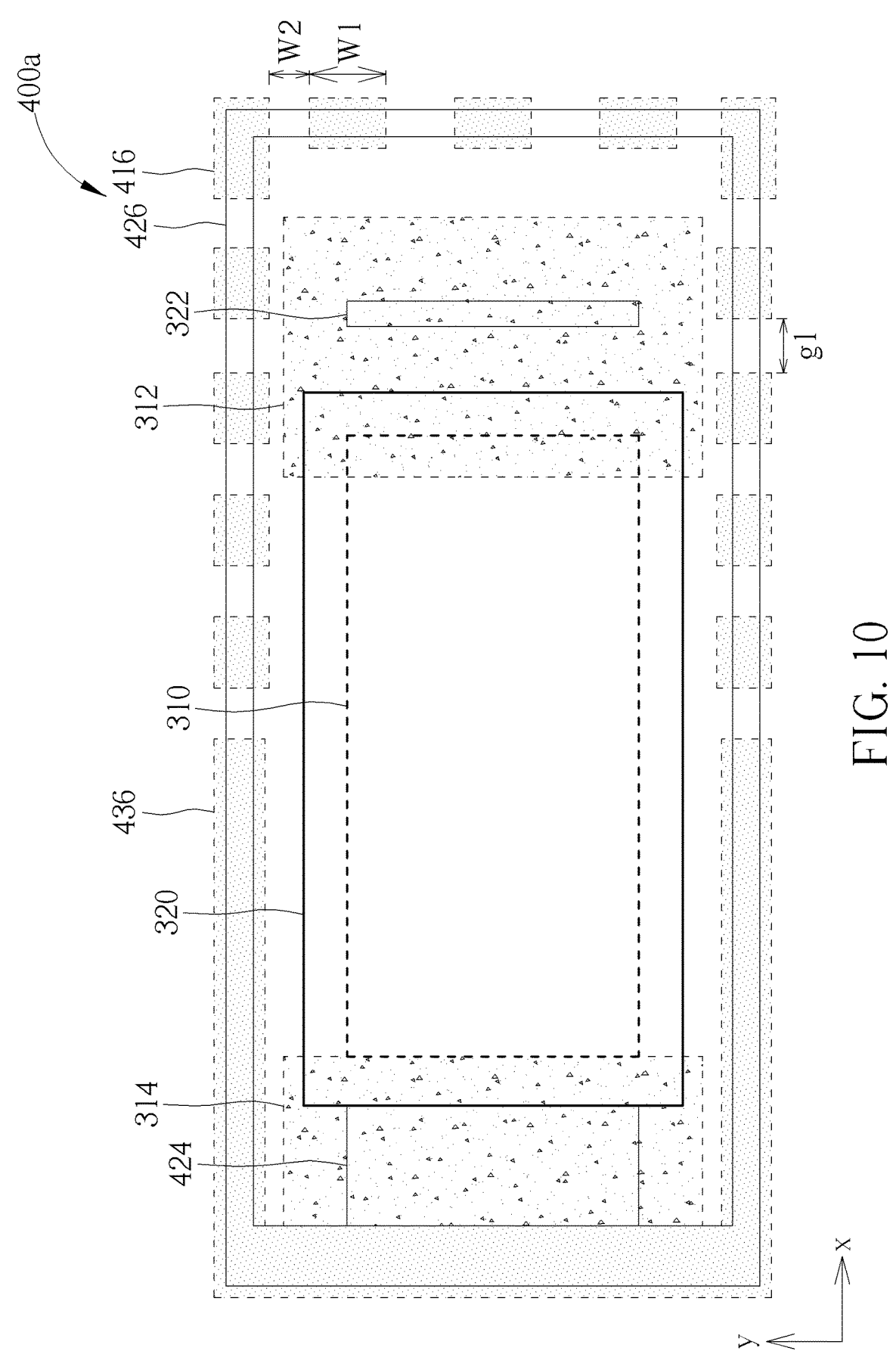

Please refer to FIG. 8 to FIG. 10, which are schematic diagrams illustrating a semiconductor device 400 according to the third embodiment of the present disclosure. The structure of the semiconductor device 400 of the present embodiment is substantially similar to that of the semiconductor device 300 in the aforementioned second embodiment, and includes the substrate 301, the diffusion region 310, the first field regions 312, 314, and the source/drain region 322 disposed within the substrate 301, and the gate structure 320 disposed on the substrate 301, with all similarity between the present embodiment and the aforementioned embodiment being not redundant described hereinafter. The difference between the present embodiment and the aforementioned embodiment is mainly in that the source/drain regions 322, 424 of the semiconductor device 400 includes an asymmetric structure.

Precisely speaking, as shown in FIG. 8 and FIG. 9, an isolation structure disposed at one side of the semiconductor device 400 is omitted, so that, the source/drain region 424 disposed at the one side may directly contact the gate structure 320, as well as a diffusion region 426 surrounding at the outer periphery of the first field regions 312, 314 and the source/drain regions 322, 424.

It is noteworthy that, in the present embodiment, the semiconductor device 400 also includes a plurality of second field regions 416 (including the first conductive type, such as the P-type), which are separately disposed within the substrate 301 to partially overlap with the diffusion region 426.

The second field regions 416 also include relative deeper doping locations, and relative greater doping areas in the substrate 301, with the second field regions 416 being disposed below the diffusion region 426, to directly in contact with the first field region 314, from the cross-sectional view as shown in FIG. 9, and with the second field regions 416 sequentially arranged along the outer periphery of the first field regions 312, 314, to locally surround the outer periphery of diffusion region 426, from the top view as shown in FIG. 8. In addition, the doping concentration, the length W1 in the horizontal direction (such as the x-direction) or in the vertical direction (such as the y-direction), and/or the length W2 of the gap g1 in the horizontal direction (such as the x-direction) or in the vertical direction (such as the y-direction of the second field regions 416 are all the same as those of the aforementioned second embodiment, and will not be further described thereinafter.

With these arrangements, the STI (namely, the isolation structure 302) is still disposed between the source/drain region 322 and the gate structure 320, and the STI between the source/drain region 424 and the gate structure 320 is omitted, with the source/drain region 424 and the gate structure 320 being directly in contact with each other. Then, the whole structure of the semiconductor device 400 of the present embodiment may present in an asymmetrical structure, with the source/drain region 322 at the right side of the gate structure 320 being functioned like the high-voltage terminal for receiving the high-voltage signals. However, in the present embodiment, the second field regions 416 and the diffusion region 426 also together serve as a pick-up ring for the high-voltage signals within the semiconductor device 400, and the slot-shaped, discontinuous second field regions 416 disposed around the source/drain region 322 also enables to improve the breakdown voltage of the semiconductor device 400 and the internal electrical property thereof, thereby avoiding the latch-up effect. Thus, according to the present embodiment, the semiconductor device 400 may also serve as a P-type field diffused drain MOS transistor, thereby being a high-voltage element, and which is capable to be applied to a semiconductor device with an operating voltage being higher than 20 volts (for example, being about 22 volts), but is not limited thereto.

It is additionally noted that, although the aforementioned embodiment is exemplified by sequentially arranging the slot-shaped second field regions 416 along the outer periphery of the first field regions 312, 314, to surround the first field regions 312, 314 and the source/drain regions 322, 424 at the same time, the present disclosure is not limited thereto. Please refer to FIG. 10, in another embodiment, the slot-shaped, discontinuous second field regions 416 are only disposed at the high-voltage terminal of a semiconductor device 400a, such as the source/drain region 322 at the right side, optionally, with the low-voltage terminal of the semiconductor device 400a, such as the source/drain region 424 at the left side being surrounded by a third field region 436 in a continuous, C-shaped. The third field region 436 for example includes the same doping concentration and the same doping depth as those of the second field regions 416. Accordingly, the slot-shaped second field regions 416 locally surround at the outer periphery of the high-voltage terminal (namely, the first field region 314 and the source/drain region 322), which may also achieve the functions on increasing the breakdown voltage of the semiconductor device 400a, as well as the internal electric property thereof, thereby effectively avoiding the latch-up effect.

Overall speaking, the slot-shaped field regions are disposed at least along the outer periphery of the high-voltage terminal of the semiconductor device in the present disclosure, such that the breakdown voltage and the internal electrical property are further improved without changing the doping concentration of the field regions, and with the same diffusion rule being maintained between the doped regions. Thus, the fabricating method of the present disclosure enables to gain the semiconductor device with better element reliability, under a simplified process flow and lower cost, to prevent from the latch-up effect in a more sufficient manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
two first field regions, disposed in the substrate;
a gate structure, disposed on the substrate, between the two first field regions;
a first isolation structure, disposed in one of the two first field regions, under a first side of the gate structure;
a plurality of second field regions, disposed in the substrate, the second field regions being separately arranged to surround an outer periphery of the one of the two first field regions; and
a first diffusion region disposed in the substrate to surround the two first field regions, the gate structure, and the first isolation structure, wherein the first diffusion region is partially overlapped with the second field regions.

2. The semiconductor device according to claim 1, wherein the second field regions and the two first field regions have complementary conductive types.

3. The semiconductor device according to claim 1, wherein each of the second field regions has a length and the length is ranged between 0.2 to 2 micrometers.

4. The semiconductor device according to claim 1, wherein any two adjacent one of the second field regions are spaced apart by a space, and the space is ranged between 0.2 to 1 micrometers.

5. The semiconductor device according to claim 1, further comprising:
a second isolation structure disposed in another one of the two first field regions, under a second side of the gate structure; and
the second field regions also surrounding at an outer periphery of the another one of the two first field regions.

6. The semiconductor device according to claim 5, wherein the first side and the second side of the gate structure respectively overlap with the first isolation structure and the second isolation structure.

7. The semiconductor device according to claim 5, further comprising:
two source/drain regions, respectively disposed in the two first field regions, wherein the first isolation structure and the second isolation structure are respectively disposed between the two second source/drain regions and the gate structure.

8. The semiconductor device according to claim 1, further comprising:
a third field region surrounding at an outer periphery of another one of the two first field regions, wherein the third field region is directly adjacent to the another one of the two first field regions, and the another one of the two first field regions is directly adjacent to the gate structure; and
two source/drain regions, respectively disposed in the two first field regions, wherein the first isolation structure is disposed between the gate structure and one of the two source/drain regions.

9. The semiconductor device according to claim 8, wherein another one of the two source/drain regions is directly adjacent to the third field region.

10. The semiconductor device according to claim 8, wherein the first side of the gate structure overlaps the first isolation structure and the one of two the first field regions, and the second side of the gate structure overlaps another one of the two first field regions.

11. The semiconductor device according to claim 1, further comprising:
a second diffusion region disposed in the substrate, between the two first field regions, wherein the second diffusion region is overlapped with the gate structure.

12. The semiconductor device according to claim 1, wherein the gate structure comprises a polysilicon gate or a metal gate.

13. A semiconductor device, comprising:
a high-voltage terminal;
a diffusion region surrounding the semiconductor device; and
a plurality of field regions separately arranged along an outer periphery of the high-voltage terminal to surround the high-voltage terminal, wherein the field regions and the diffusion region have a same conductive type and are partially overlapped with each other.

* * * * *